United States Patent
Kuroda et al.

(10) Patent No.: US 7,352,068 B2
(45) Date of Patent: Apr. 1, 2008

(54) MULTI-CHIP MODULE

(75) Inventors: Hiroshi Kuroda, Akishima (JP); Makoto Tetsuka, Misato (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 11/290,470

(22) Filed: Dec. 1, 2005

(65) Prior Publication Data

US 2006/0113677 A1 Jun. 1, 2006

(30) Foreign Application Priority Data

Dec. 1, 2004 (JP) .............................. 2004-349016

(51) Int. Cl.
*H01L 23/40* (2006.01)
(52) U.S. Cl. .................. 257/777; 257/685; 257/686; 257/E25.031; 257/E25.032
(58) Field of Classification Search ................ 257/686, 257/723, 685, 777, 726, E25.031, E25.032, 257/E23.042; 438/109
See application file for complete search history.

(56) References Cited

U.S. PATENT DOCUMENTS 6,943,294 B2 * 9/2005 Kang et al. .................. 174/541

2005/0104183 A1 * 5/2005 Kuroda et al. .............. 257/686

FOREIGN PATENT DOCUMENTS

| JP | 6-244360 | 9/1994 |
| JP | 2003-007963 | 1/2003 |
| JP | 2003-224242 | 8/2003 |

* cited by examiner

*Primary Examiner*—Long K. Tran
(74) *Attorney, Agent, or Firm*—Antonelli, Terry, Stout & Kraus, LLP.

(57) ABSTRACT

A multi-chip module is provided which allows memory space extension to improve function and performance. A first semiconductor chip is mounted on a mounting substrate, and a first semiconductor memory chip is mounted over the first semiconductor chip. A second semiconductor memory chip having the same circuitry and the same memory capacity as the first semiconductor memory chip is mounted on a spacer formed on the first memory chip in the same direction as the first semiconductor memory chip. An electrode is independently formed corresponding to a bonding pad to which a selective signal of the first semiconductor memory chip and the second semiconductor memory chip is supplied. A plurality of electrodes are formed in common corresponding to a plurality of bonding pads to which the same signal is respectively supplied except for the selective signal.

8 Claims, 6 Drawing Sheets

MULTI-CHIP MODULE

CROSS-REFERENCE TO RELATED APPLICATIONS

The present application claims priority from Japanese patent application No. 2004-349016 filed on Dec. 1, 2004, the content of which is hereby incorporated by reference into this application.

1. Field of the Invention

This invention relates to a multi-chip module (MCM), and for example, relates to an effective technology in the application to a multi-chip module in which a plurality of semiconductor chips with some functions different from one another are integrated as substantially one semiconductor integrated circuit device by mounting them on one mounting substrate.

2. Description of the Background Art

In the so-called multi-chip module technology, a plurality of semiconductor chips are mounted on a mounting substrate which has a plurality of internal wirings and a plurality of external terminals, and these semiconductor chips and the mounting substrate are integrated with each other as a device. Japanese Unexamined Patent Publication No. Hei 6-224360, Japanese Unexamined Patent Publication No. 2003-7963, and Japanese Unexamined Patent Publication No. 2003-224242 disclose a plural-chip stacked structure having a space in which bonding wires are disposed. That is, in the structure disclosed in Japanese Unexamined Patent Publication No. Hei 6-224360, a step is formed on a back surface of a chip. A spacer is formed in the structure disclosed in Japanese Unexamined Patent Publication No. 2003-7963. In the structure disclosed in Japanese Unexamined Patent Publication No. 2003-224242, a notch is formed in a chip back surface.

[Patent Reference 1] Japanese Unexamined Patent Publication No. Hei 6-224360

[Patent Reference 2] Japanese Unexamined Patent Publication No. 2003-7963

[Patent Reference 3] Japanese Unexamined Patent Publication No. 2003-224242

SUMMARY OF THE INVENTION

Advance in semiconductor technology has directed the technology toward construction of a structure in which a plurality of semiconductor chips for constituting an electronic system such as a microcomputer chip, a DRAM chip, and a flash memory chip are configured as a semiconductor device in the form of one package as a whole. This is because when not a plurality of semiconductor chips but a plurality of semiconductor devices obtained by respectively packaging semiconductor chips by a usual packaging technique such as QFP (Quad Flat Package), CSP (Chip Size Package or Chip Scale Package), or BGA (Ball Grid Array) are employed and the plurality of semiconductor devices are mounted on a mounting board such as a printed circuit board, it becomes difficult to shorten the distance between the semiconductor chips and their wiring distance, and as a result, a signal delay caused by wiring becomes large and improvement in the speed and miniaturization of the resulting device are restricted.

On the other hand, in the multi-chip module (Multi Chip Module) technology, a plurality of semiconductor chips in the form of a remarkably small, so-called bear chip are employed and made into a semiconductor device in the form of one package, and as a result, the wiring distance between the respective chips can be shortened and the characteristics of the semiconductor device can be improved. The semiconductor device can be miniaturized by putting the plurality of chips into one package, and the semiconductor device can be miniaturized by decreasing the mounting area. In the Patent References 1 to 3, attention is not paid to improvement in the function and further miniaturization of the device as a whole which are the features of MCM (multi-chip module), but rather the respective chips are just made into the stack structure.

As semiconductor chips for constituting MCM, it is desirable to choose ones related closely to one another, such as a microcomputer chip and a dynamic type RAM (DRAM) or flash memory to be coupled with the microcomputer chip. When the combination of such a plurality of semiconductor chips related closely to one another is chosen, one system can be mounted in a package, taking full advantage of the characteristic of MCM, and a so-called SiP (System in Package) can be realized. When one system is constituted from a combination of a plurality of semiconductor chips related closely to one another as mentioned above, it is necessary to design a separate mounting substrate corresponding to each combination. The present inventors have paid attention to the fact that this drawback can be coped with in some cases in, for example, a signal processing system for a digital still camera, cellular phones and the like, just by extending a memory space in accordance with improvement in a function or performance of the system, and the inventors have attempted to apply this to a system in which the same mounting substrate is used and the memory space is extended.

A purpose of the present invention is to offer a multi-chip module which allows the memory space extension needed corresponding to improvement in the function or performance. The above-described and other purposes and novel features of the present invention will become apparent from the description herein and accompanying drawings.

Of aspects of the invention disclosed in the present application, typical ones will next be summarized briefly. That is, a first semiconductor chip is surface-mounted on a surface of a mounting substrate, and a first semiconductor memory chip mounted over the first semiconductor chip having a bonding pad formed in a periphery portion of a surface of the first semiconductor chip, wherein it is premised that, over a first spacer mounted over the first semiconductor memory chip in a part except a prescribed area including a part where the bonding pad is formed on the first semiconductor memory chip surface, a second semiconductor memory chip having the same circuitry and the same memory capacity as the first semiconductor memory chip is mounted in the same direction as the first semiconductor memory chip, on the mounting substrate surface part, an electrode is independently formed corresponding to a bonding pad to which a selective signal of the first semiconductor memory chip and the second semiconductor memory chip is supplied, and a plurality of electrodes are formed in common corresponding to a plurality of bonding pads to which the same signal is respectively supplied except for the selective signal.

A system with two kinds of memory capacities of the first semi-conductor memory chip and the first and the second semi-conductor memory chips is realizable, using the same mounting substrate.

DETAILED DESCRIPTION OF THE PREFERRED EMBODIMENTS

Figure 1:
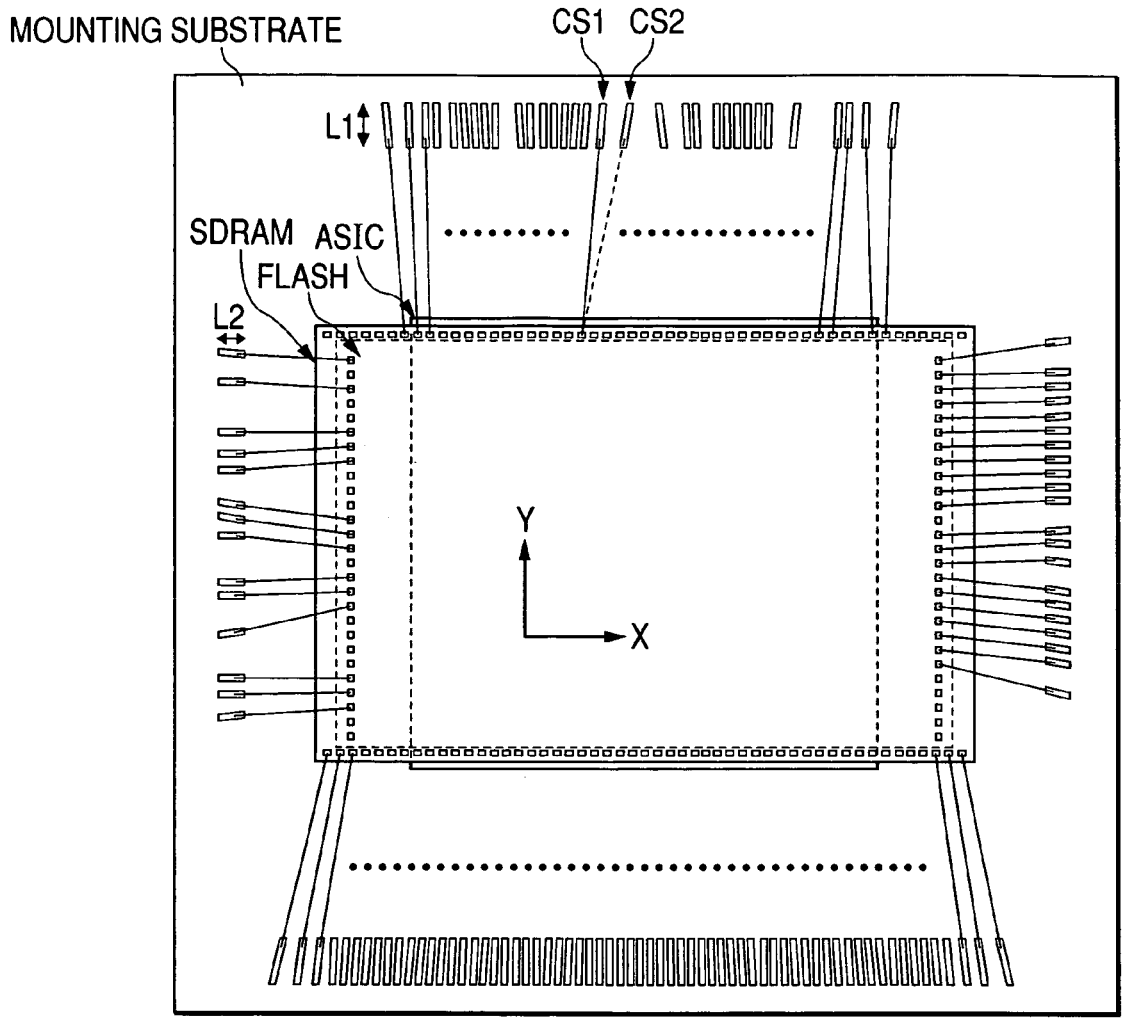
FIG. 1 is an outline plan view showing one example of MCM (SiP) concerning this invention.

An outline plan view of one example of MCM (SiP) concerning this invention is shown in FIG. 1. On a mounting substrate surface, an application specific IC (henceforth ASIC) which has a one-chip microcomputer function containing CPU (central processing unit) is surface-mounted. On the surface of this ASIC, a nonvolatile memory (henceforth FLASH) is mounted back-to-back to the ASIC, and a synchronous DRAM (henceforth SDRAM) is mounted via a spacer on it. The above FLASH is a so-called AND type although not restricted in particular, and does not have any independent address terminal although not restricted in particular. An address signal is serially inputted in a time sharing manner using a data terminal. For this reason, bonding pads are arranged along the FLASH chip perimeter at both sides in the Y direction in this drawing, electrodes are arranged on a mounting substrate corresponding to these bonding pads, and connected to these bonding pads through wires.

In the SDRAM, bonding pads are arranged along the SDRAM chip perimeter at both sides of the X-direction in this drawing, electrodes are arranged on a mounting substrate corresponding to these bonding pads, and connected to these bonding pads through wires. Thus, by rotating 90° and piling up so that the bonding pad rows of FLASH and SDRAM whose bonding pads are formed in opposite sides of each chip do not overlap, it is possible to arrange the bonding pads dispersedly so that the electrodes formed on the mounting substrate may surround the portion for chip mounting and make the size of a mounting substrate small, and prevents a short circuit among the bonding wires connected with FLASH and SDRAM from occurring.

In this example, the electrodes of a mounting substrate are formed on the assumption that the same memory chip of SDRAM is further piled up in the same direction via a spacer. That is, the high performance or high efficiency of a system is realized by performing parallel connection of two SDRAMs, and realizing a memory with twice as much memory capacity. For this reason, an address terminal, a data terminal, and the control terminal which directs the mode of operation are connected in common with the electrode formed on the mounting substrate. However, regarding the selective signal (a chip select signal or a chip enable signal) which directs access of a memory chip, electrodes CS1 and CS2 are formed on the mounting substrate since the selective signals are required to be supplied independently. That is, when only one SDRAM is mounted, a bonding wire is formed at electrode CS1 shown in this drawing, and CS2 is left as an empty terminal. When two SDRAM(s) are mounted, a bonding wire is formed at each of electrode CS1 and CS2 shown in this drawing. In this drawing, in order to perform the distinction, the dotted line shows the bonding wire of CS2.

Although many bonding wires are formed between SDRAM and the electrodes formed on the mounting substrate, a part of them is shown as an example. Regarding two bonding wires connected to the bonding pads of two SDRAM(s) from the same electrode of a mounting substrate, since they overlap, they are expressed with one line. Thus, in order to form two bonding wires, the length L1 of the electrode formed on a mounting substrate is formed longer than the length L2 of the electrode of the FLASH, and only the space which connects two bonding wires to two SDRAM(s) is secured.

In FIG. 2 to FIG. 9, the outline sectional view explaining one example of MCM concerning this invention is shown. In FIG. 2 to FIG. 9, the structure of MCM concerning this invention is expressed in the form of the assembly flow. The outline sectional view in the X direction of the above-mentioned FIG. 1 is shown in FIG. 2, FIG. 4, FIG. 6, and FIG. 8, and the outline sectional view in the Y direction of the above-mentioned FIG. 1 is shown in FIG. 3, FIG. 5, FIG. 7, and FIG. 9. FIG. 2 and FIG. 3, FIG. 4 and FIG. 5, FIG. 6 and FIG. 7, and FIG. 8 and FIG. 9 show each the same step.

In MCM in this example, an application specified integrated circuit, namely, a microcomputer LSI which constitutes an application specific IC and including CPU (above-mentioned ASIC), the synchronous dynamic random access memory, two at the maximum (Synchronous Dynamic Random Access Memory, above SDRAM), and flash EEPROM (Flash Electrically Erasable and Programmable Read Only Memory; above FLASH) are arranged in a stacked structure.

Figure 2:
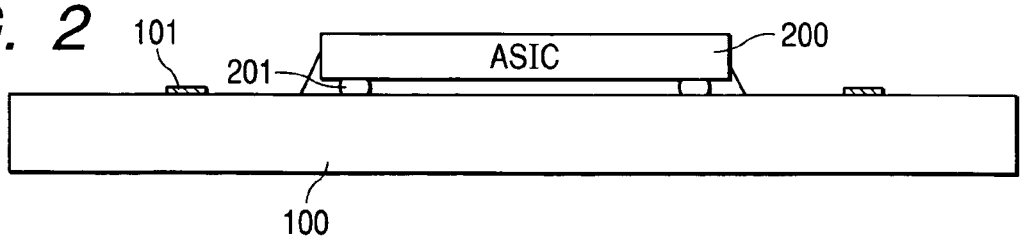
FIG. 2 is a sectional view of one example for explaining MCM concerning this invention.
Figure 3:
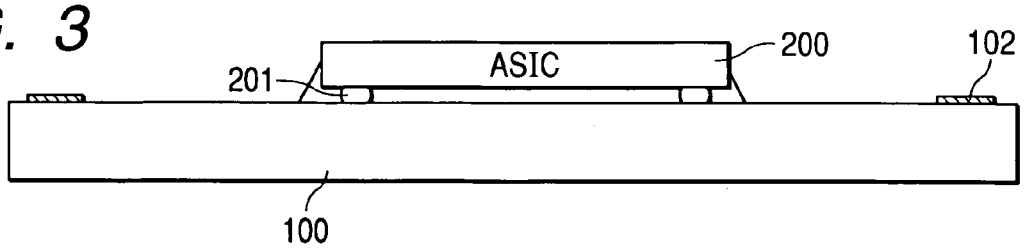
FIG. 3 is a sectional view of one example for explaining MCM concerning this invention.

Although not restricted especially, SDRAM 500, 503 which are put together, each has the memory capacity of about 256M bit, and it is considered to create a big memory capacity like 512M bit in total when the two are combined as mentioned above. FLASH 300 has a memory capacity like 128M bit. In this example, as shown in FIG. 2 and FIG. 3, one semiconductor chip other than the above-mentioned two SDRAM 500, 503, i.e. ASIC 200 in the example of FIG. 2-FIG. 9, is surface-mounted on mounting substrate 100. That is, Au bump 201 is formed on the pad of ASIC 200 which is a bear chip, an anisotropic conductive film ACF is temporarily attached to the pad of mounting substrate 100, ASIC 200 of the bear chip form that has which Au bump 201 formed on the above-mentioned pad is mounted on mounting substrate 100, and thermo-compression bonding is carried out to effect surface-mounting.

Figure 4:
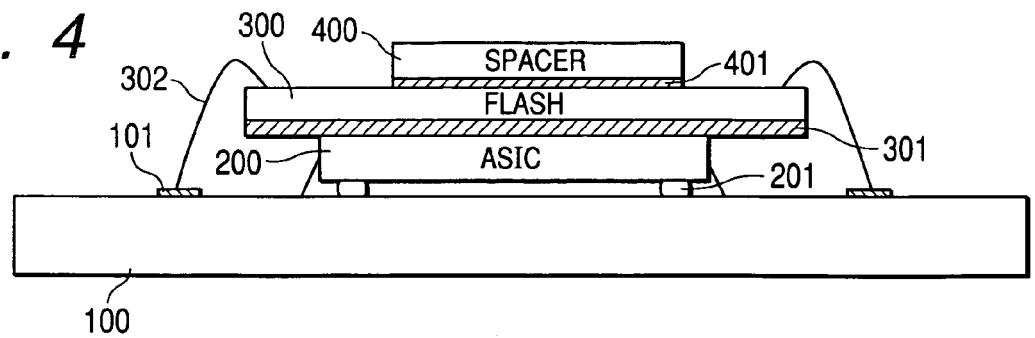
FIG. 4 is a sectional view of one example for explaining MCM concerning this invention.
Figure 5:
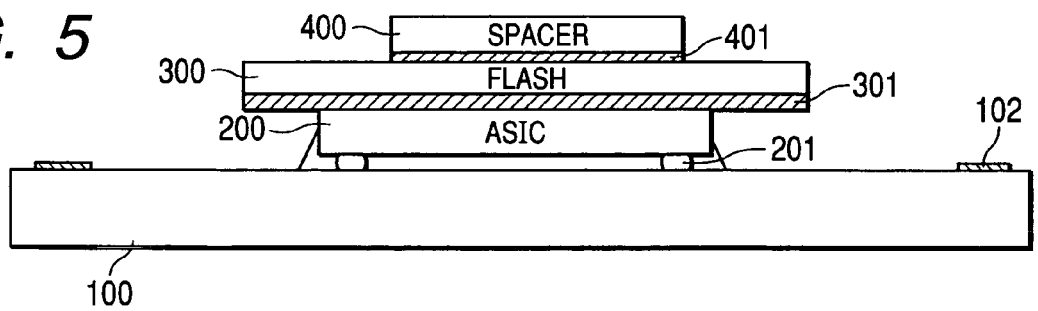
FIG. 5 is a sectional view of one example for explaining MCM concerning this invention.

As shown in FIG. 4 and FIG. 5, FLASH 300 is mounted back-to-back to the above-mentioned ASIC 200 (so that the back surfaces of the chip face each other). That is, FLASH 300 is adhered to ASIC 200 back-to-back using thermosetting adhesive, or die bond film 301 formed on the back surface, and as shown in FIG. 4, is connected with corresponding electrode 101 of mounting substrate 100 with wire 302 by wire bonding. Further, spacer 400 is formed in the chip center portion except a chip periphery including the part in which the bonding pad for the above-mentioned wire bonding is formed on FLASH 300. Although not restricted in particular, this spacer 400 is formed of a silicon substrate, in order to equalize the coefficient of thermal expansion with the semiconductor chip of stacked structure, and is adhered using thermosetting adhesive, or die bond film 401 formed on the back surface.

Figure 6:
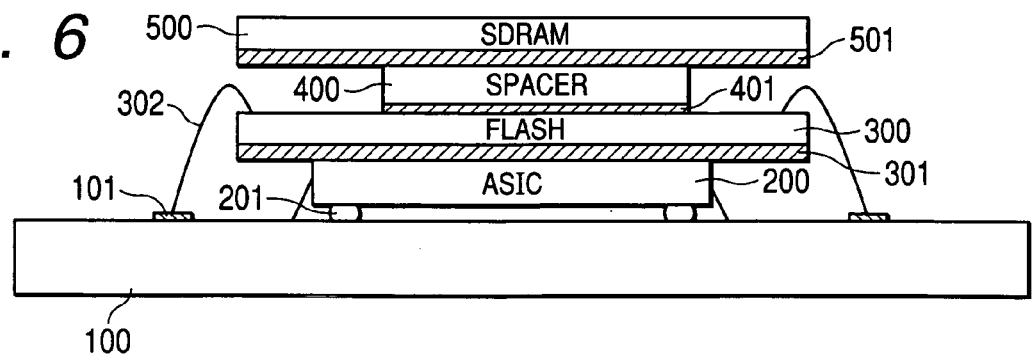
FIG. 6 is a sectional view of one example for explaining MCM concerning this invention.
Figure 7:
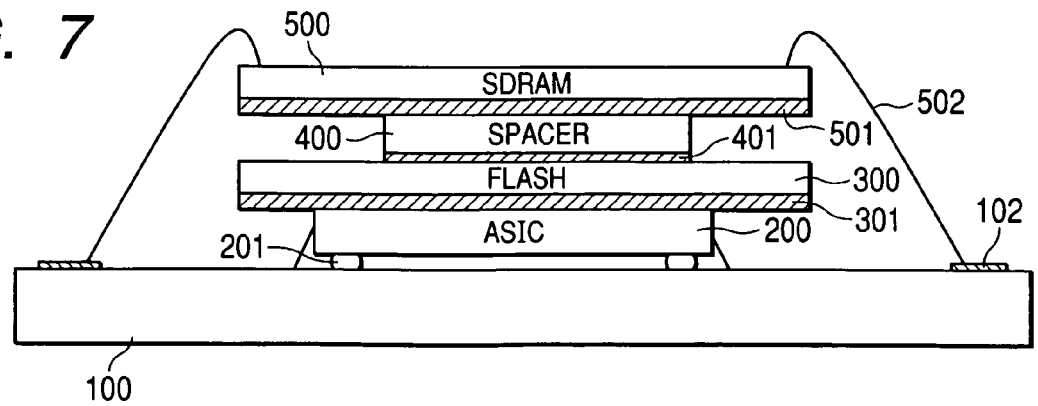
FIG. 7 is a sectional view of one example for explaining MCM concerning this invention.

As shown in FIG. 6 and FIG. 7, SDRAM 500 is mounted in the surface of the above-mentioned spacer 400. That is, SDRAM 500 is adhered on spacer 400 using thermosetting adhesive, or die bond film 501 formed on the back surface, and as shown in FIG. 7, is connected with corresponding electrode 102 of mounting substrate 100 with wire 502 by wire bonding. Under the present circumstances, die bond film 501 formed on the back side of upper SDRAM 500 can be used also for maintaining electric insulation even if wire 302 formed at the surface of FLASH 300 which is a lower layer contacts the back surface of SDRAM which is an upper layer. Even when adhering SDRAM 500 on spacer 400 using the thermosetting adhesive, it is desirable to apply this all over the back surface of SDRAM 500 which is the upper layer to give the above-mentioned electric insulation.

Figure 8:
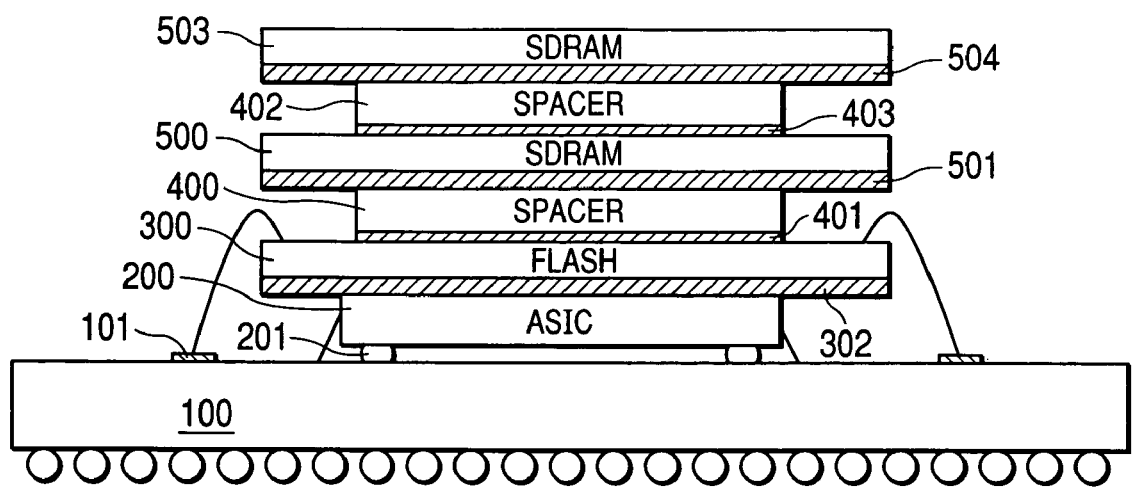
FIG. 8 is a sectional view of one example for explaining MCM concerning this invention.
Figure 9:
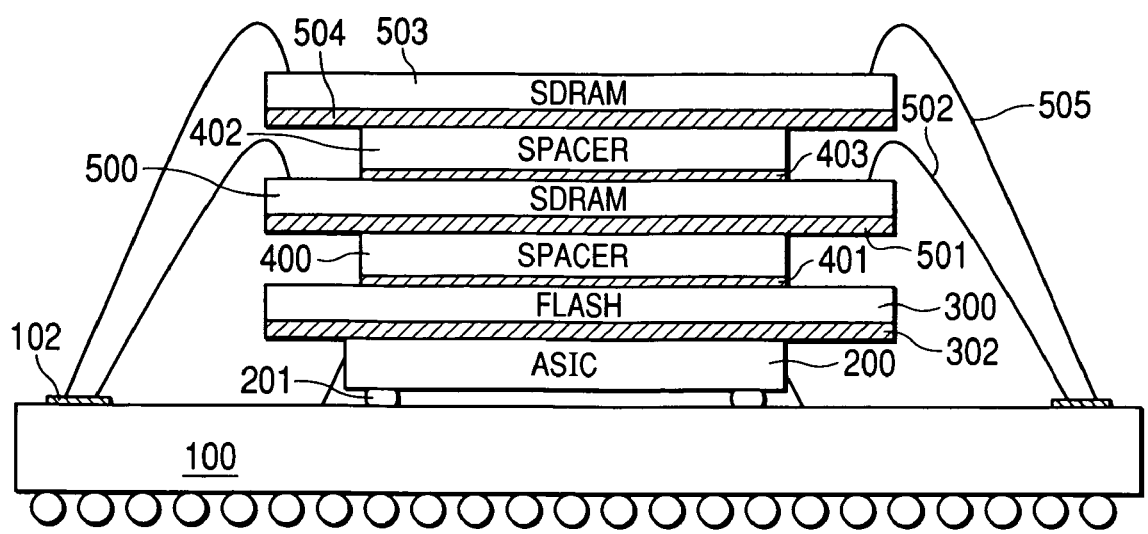
FIG. 9 is a sectional view of one example for explaining MCM concerning this invention.

As shown in FIG. 8 and FIG. 9, the same spacer 402 as the above is adhered to the chip center portion except the chip periphery including the part in which the bonding pad for the above-mentioned wire bonding is formed on SDRAM 500 using die bond film 403. And SDRAM 503 is mounted on the surface of the above-mentioned spacer 402. That is, SDRAM 503 is adhered on spacer 402 using thermosetting adhesive, or die bond film 504 formed on the back surface, and, as shown in FIG. 9, is connected with corresponding electrode 102 of mounting substrate 100 with wire 505 by wire bonding. Two bonding wires are formed in the electrode except electrode CS1 and CS2 corresponding to the above selective signals. Die bond film 504 formed in the back side of upper SDRAM 503 also on this occasion can be used also for maintaining electric insulation even if wire 502 formed in SDRAM 500 which is a lower layer contacts the back surface of SDRAM which is an upper layer.

Although omitted in FIG. 8 and FIG. 9, the above-mentioned ASIC 200, FLASH 300, SDRAM 500 (503), spacer 400 (402), and the bonding wires formed in them are molded with a resin molded body, and MCM is formed by conducing the ball attachment reflow to form an external terminal at the back side of mounting substrate 100 as shown in FIG. 8 and FIG. 9. The above (503) and (402) mean that they are formed in the case of a product which makes memory space of SDRAM double.

The above-mentioned ASIC 200 has a plurality of bump electrodes 201 with which surface mounting is possible on mounting substrate 100. ASIC 200 is made by, according to need, the technology called Area Array Pad, that is, the technology which forms wiring which enables rearrangement of a pad electrode (bonding pad) via an insulating layer made of polyimide resin on the circuit formation surface of the semiconductor chip in which formation of an element and wiring are completed, and forms a pad electrode (land electrode for bump bonding) on this wiring.

In the above-mentioned Area Array Pad technology, the pad electrode as an external terminal in a semiconductor chip arranged by comparatively small pitch like several tens of μm to 100 μm pitch is changed into the bump electrode array of a diameter like 0.1 mm-0.2 mm and of comparatively big pitch like 400 μm-600 μm pitch. For this reason, Area Array Pad technology is effective in the surface-mounting chip making of a semiconductor chip forming many pad electrodes in a semiconductor chip like ASIC 200.

The above-mentioned mounting substrate 100 has an insulating substrate which includes glass epoxy or glass, comparatively fine internal wiring having multilayer interconnection structure formed on this insulating substrate, a plurality of lands by which electrical coupling can be performed to the bump electrodes of a semiconductor chip, and a plurality of external terminals. In mounting substrate 100, in the main surface at the mounting side of above-mentioned semiconductor chip, the electrode for making wire bonding with the bonding pad formed in SDRAM 500, 503 and FLASH 300 other than the above-mentioned land is also formed. Among these wirings, in order to make easy a test of SDRAM etc. which is mentioned later, that is, in order to be able to carry out memory access of the SDRAM independently, a wiring which connects the selective-signal terminal at the side of ASIC and the selective-signal terminal at the side of SDRAM is not formed on the mounting substrate. These wirings are connected by mounting MCM on an assembling substrate, and access to SDRAM is attained with the microcomputer formed in ASIC.

Figure 10A:
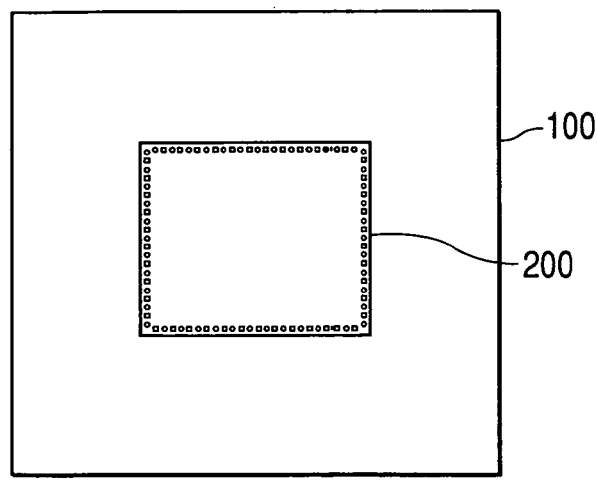
FIGS. 10(A) to 10(c) are plan views corresponding to FIG. 2-FIG. 7.
Figure 10B:
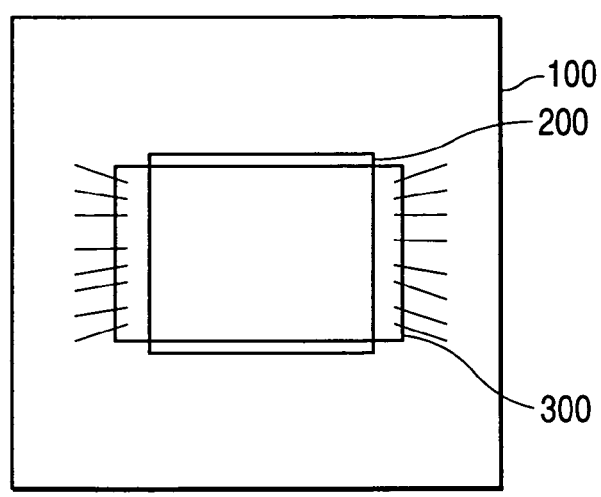
Figure 10C:
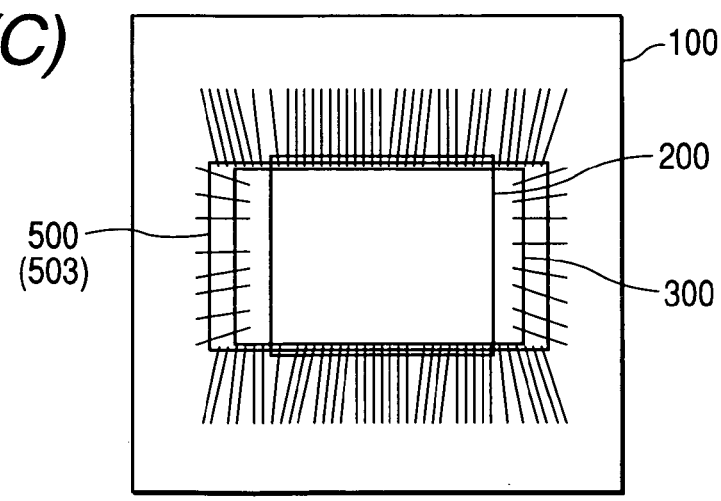

The plan view corresponding to FIG. 2-FIG. 7 is shown in FIGS. 10 (A)-(C). FIG. 10 (A) corresponds to FIG. 2 and FIG. 3, and ASIC 200 is surface-mounted on mounting substrate 100. FIG. 10 (B) corresponds to FIG. 4 and FIG. 5, FLASH 300 is piled up and mounted on the above-mentioned ASIC 200, and a bonding wire is formed. FIG. 10 (C) corresponds to FIG. 6 and FIG. 7, SDRAM 500 is piled up and mounted over FLASH 300 via the spacer which is not illustrated, and a bonding wire is formed. When an SDRAM is further mounted corresponding to FIG. 8 and FIG. 9, the SDRAM is similarly mounted via the spacer which is not illustrated and a bonding wire is formed like the above except for the wire corresponding to a selective signal.

Figure 11:
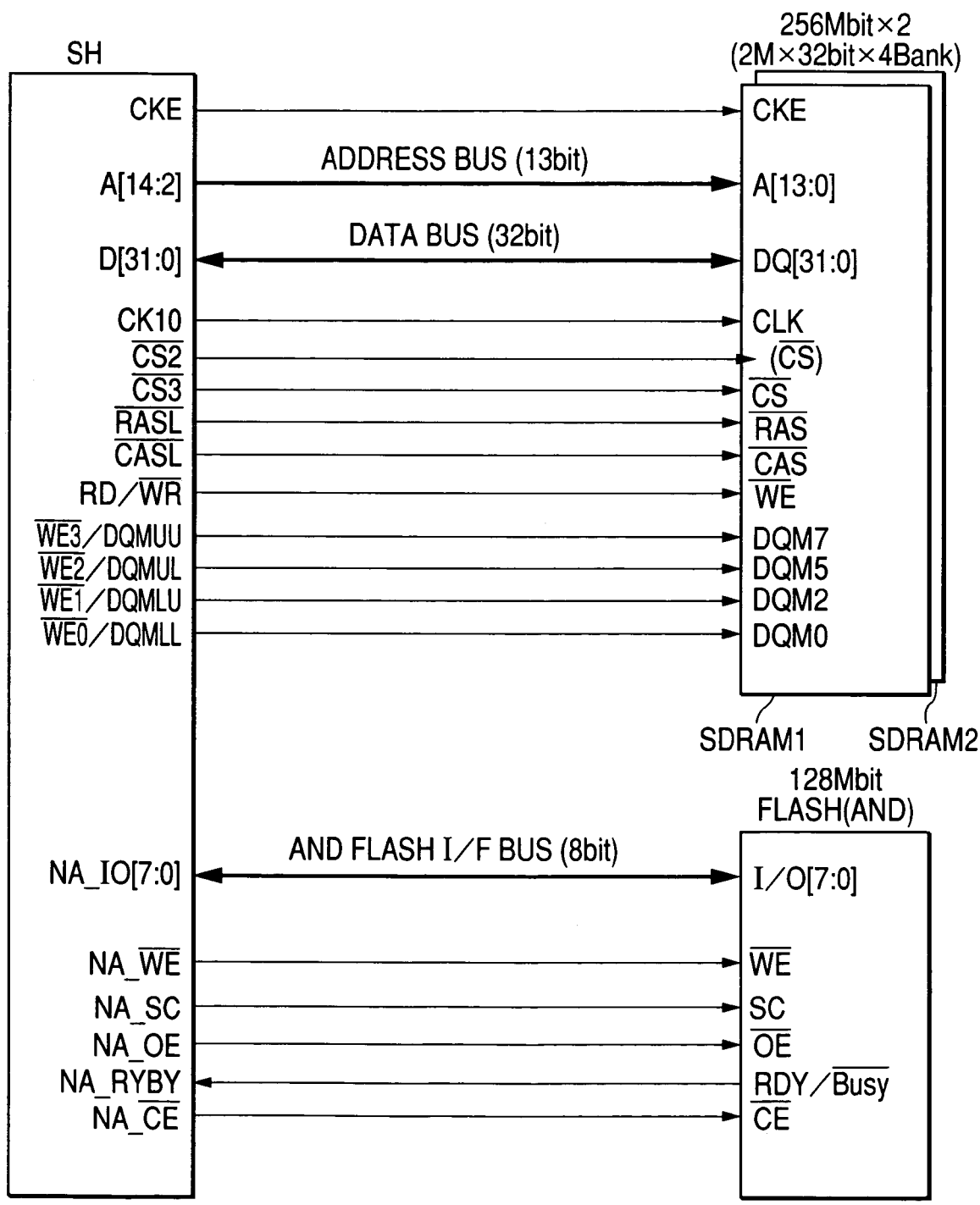
FIG. 11 is a block diagram showing one example of MCM concerning this invention.

The block diagram of one example of MCM concerning this invention is shown in FIG. 11. In this drawing, the electrical connecting relation of ASIC with microcomputer SH, such as FIG. 1, and SDRAM and FLASH is shown together with the signal terminal name. In order to improve efficiency and miniaturization, while taking advantage of the characteristic of MCM like FIG. 11 in which memory SDRAM and flash memory FLASH are combined with microcomputer SH, microcomputer SH and memory SDRAM by which signals are exchanged mutually are mutually connected by the address bus (13 bits), data bus (32 bits), and control bus which are formed on the mounting substrate.

For example, an address bus includes 13 lines corresponding to address terminals A0-A12 of two SDRAM1 and SDRAM2, and a data bus includes 32 lines corresponded to data terminals DQ0-DQ31 of two chips, SDRAM1 and SDRAM2. As for the above-mentioned microcomputer SH, the address terminals of A2 to A14 are connected to the above-mentioned address bus, and D0-D31 are connected to the above-mentioned data bus.

The above-mentioned microcomputer SH has control output terminals of CKIO, CKE, CS2B, CS3B, RASLB, CASLB, RD/WRB, WE3B/DQMUU, WE2B/DQMUL, WE1B/DQMLU, and WE0B/DQMLL corresponding to SDRAM, and which are respectively connected to CLK, CKE, CSB, RASB, CASB, WEB, DQM7, DQM5, DQM2, and DQM0 of SDRAM. In this case, two chips, SDRAM1 and SDRAM2, are mounted as SDRAM. Two chip select signal CS2B and CS3B of microcomputer SH are assigned to these two SDRAM1 and SDRAM2, and either is chosen according to whether the signal is CS2B or CS3B. Therefore, these signals CS2B and CS3B correspond to electrodes CS1 and CS2 of FIG. 1 one to one, and respectively, other signal pins are all set to SDRAM1 and SARM2 in common, and parallel connection is performed to them.

In FIG. 11, terminals named to include B correspond to the logic symbols which makes a low level that gave the over-bar to the terminal name in the drawing an active level. Above-mentioned terminals WE3B/DQMUU, WE2B/DQMUL, WE1B/DQMLU, and WE0B/DQMLL are mask signals, and WE3B/DQMUU, WE2B/DQMUL, WE1B/DQMLU, and WE0B/DQMLL perform the alternative mask of a write/read by dividing the above-mentioned 32 bit data bus into 4 sets of 8-bits. Microcomputer SH of this example is provided with the interface corresponding to the above-mentioned flash memory FLASH. That is, flash memory FLASH is provided with data terminal I/O (7:0), and control signals WEB, SC, OEB, RDY/BusyB and CEB. Corresponding to this, NA_IO (7:0), and control-signals NA_WEB, NA_SC, NA_OEB, NA_RYBY and NA_CEB are formed also in microcomputer SH.

Figure 12:
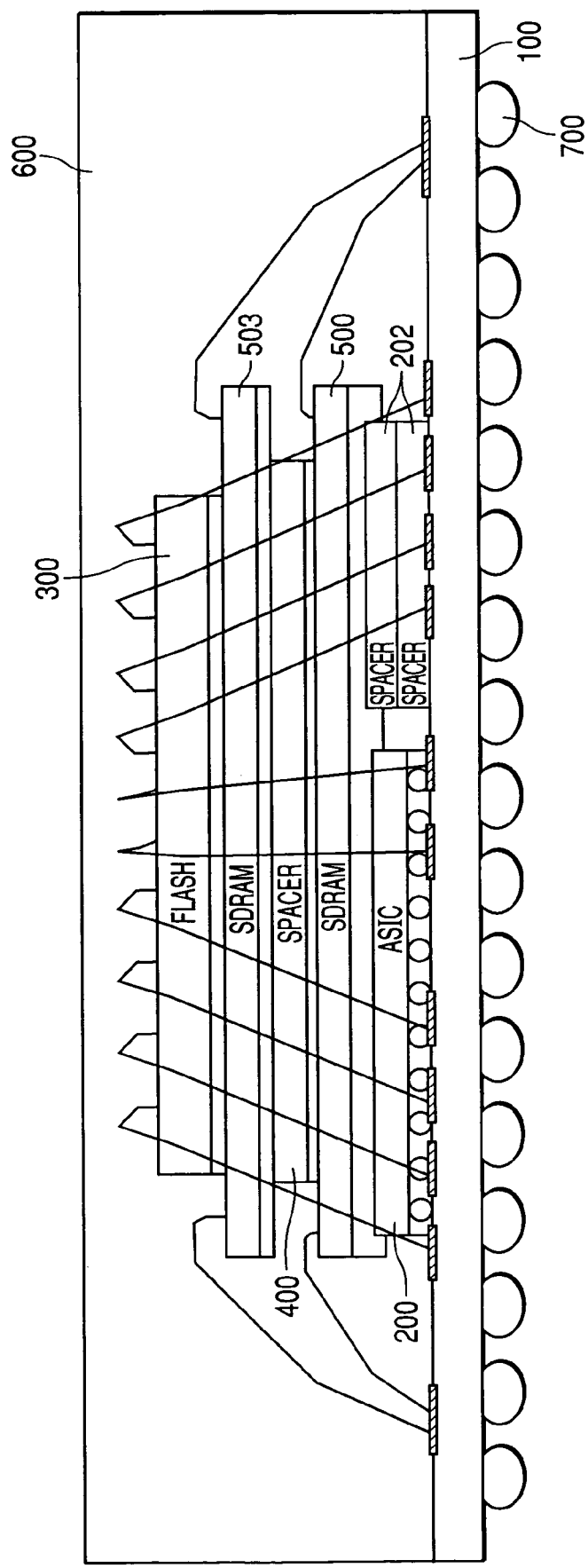
FIG. 12 is a sectional view showing another example of MCM concerning this invention.

A sectional view of another example of MCM concerning this invention is shown in FIG. 12. The mounting order of FLASH 300 and SDRAM is reversed in this example. That is, ASIC 200 is surface-mounted like the above-mentioned example on mounting substrate 100. In this case, when the size of ASIC 200 is smaller than SDRAMs 500, 503 mounted on ASIC 200, in order that SDRAMs 500, 503 are mounted stably, spacer 202 is formed. That is, ASIC 200 is surface-mounted as mentioned above, and the above-mentioned spacer 202 is formed so that the lack of the mechanical strength at the time of bonding due to the overhang length of SDRAM being long may be compensated. And FLASH 300 is mounted on the above-mentioned DRAM 503. In this case, since the direction of a wire formed in SDRAM differs by 90° as mentioned above, a spacer is unnecessary. Since only one SDRAM is mounted back-to-back on ASIC when half capacity is sufficient as a memory space, it becomes still more unnecessary.

Generally a larger number of terminals are formed on ASIC 200 than the above-mentioned SDRAM 500, 503 or FLASH300. Thus, by performing the above surface-mounting, the number of bonding electrodes formed in the mounting substrate side can be reduced substantially, and the size of a mounting substrate can be made small. Even with respect to the performance of circuit operation, when the bonding wire formed comparatively long is used in the signal transmission channel of microprocessor CPU which needs to perform high-speed signal propagation, the problem that propagation of a clock of high frequency and the signal synchronized with it is retarded by the comparatively big inductance component of a bonding wire arises. However, in this example, not only the miniaturization of a mounting substrate is possible as mentioned above, but also it becomes advantageous in respect of the performance of circuit operation.

As mentioned above, the present invention accomplished by the present inventors is concretely explained based on the above examples, but the present invention is not limited by the above examples, but variations and modifications may be made, of course, in various ways to the extent that they do not deviate from the gist of the invention. For example, it is acceptable to provide an additional SDRAM on the two SDRAM(s) as a premise. In this case, the electrodes corresponding to three SDRAM(s) are formed on the mounting substrate. The above-mentioned memory may be DRAM instead of SDRAM. This invention can be widely used for a semiconductor device which constitutes a multi-chip module.

What is claimed is:

1. A multi-chip module, comprising:
   a first semiconductor chip surface-mounted on a surface of a mounting substrate;
   a second semiconductor chip mounted back-to-back over the first semiconductor chip, and having a bonding pad in a periphery portion thereof;
   a first semiconductor memory chip mounted, via a first spacer, over the first semiconductor chip, and having a bonding pad formed in a periphery portion on a surface of the first semiconductor memory chip;
   a second semiconductor memory chip mounted via a second spacer over the first semiconductor memory chip, and in the same direction as the first semiconductor chip, said second semiconductor chip containing the same circuitry with the same memory capacity as that of the first semiconductor memory chip,
   wherein the second spacer is mounted over a part of the surface of the first semiconductor memory chip where the bonding pad is not formed;
   an electrode independently formed on the mounting substrate surface part corresponding to a bonding pad to which a selective signal of the first semiconductor memory chip and the second semiconductor memory chip is supplied; and
   a plurality of electrodes formed on the mounting substrate surface part in common corresponding to a plurality of bonding pads to which the same signal is respectively supplied except for the selective signal; and
   wherein die bond films which adhere the first semiconductor memory chip and the second semiconductor memory chip respectively to surfaces of the first spacer and the second spacer are disposed on back surfaces of the first semiconductor memory chip and the second semiconductor memory chip, the back surface of the first semiconductor memory chip and of the second semiconductor memory chip being electrically insulated,
   wherein a thickness of the first semiconductor memory chip and the second semiconductor memory chip is thickly formed rather than the first semiconductor chip or the second semiconductor chip, and
   wherein the first semiconductor chip is a semiconductor chip including a microprocessor,
   the second semiconductor chip is a memory chip which can erase electrically, and records memory information in a nonvolatile memory cell, and
   the first and second semiconductor memory chips are memory chips which store memory information in a dynamic type memory cell, respectively.

2. A multi-chip module according to claim 1,
   wherein a multi-chip module which mounts only the first semiconductor memory chip, and a multi-chip module which mounts both the first semiconductor memory chip and the second semiconductor memory chip are different with respect to the kind of a multi-chip module.

3. A multi-chip module according to claim 2,
   wherein the selective signal is supplied to the first semiconductor memory chip and the second semiconductor memory chip from the first semiconductor chip, and the signal mute which sends the selective signal does not exist on the mounting substrate.

4. A multi-chip module according to claim 1,
wherein the selective signal is supplied to the first semiconductor memory chip and the second semiconductor memory chip from the first semiconductor chip, and the signal route which sends the selective signal does not exist on the mounting substrate.

5. A multi-chip module, comprising:
a first semiconductor chip surface-mounted on a surface of a mounting substrate;
a second semiconductor chip mounted back-to-back over the first semiconductor chip, and having bonding pads in a periphery portion thereof;
a first semiconductor memory chip mounted, via a first spacer, over the first semiconductor chip, and having bonding pads formed in a periphery portion on a surface of the first semiconductor memory chip;
a second semiconductor memory chip mounted via a second spacer over the first semiconductor memory chip, and in the same direction as the first semiconductor chip, said second semiconductor chip containing the same circuitry with the same memory capacity as that of the first semiconductor memory chip,
wherein the second spacer is mounted over a part of the surface of the first semiconductor memory chip where the bonding pads are not formed;
an electrode independently formed on the mounting substrate surface part corresponding to a bonding pad to which a selective signal of the first semiconductor memory chip and the second semiconductor memory chip is supplied; and
a plurality of electrodes formed on the mounting substrate surface part in common corresponding to a plurality of bonding pads to which the same signal is respectively supplied except for the selective signal; and
wherein die bond films which adhere the first semiconductor memory chip and the second semiconductor memory chip respectively to surfaces of the first spacer and the second spacer are disposed on back surfaces of the first semiconductor memory chip and the second semiconductor memory chip, the back surface of the first semiconductor memory chip and of the second semiconductor memory chip being electrically insulated,
wherein the first semiconductor chip is a semiconductor chip including a microprocessor,
the second semiconductor chip is a memory chip including nonvolatile memory cells for electrically erasing, and recording memory information, and
the first and second semiconductor memory chips are memory chips including dynamic type memory cells for storing information, respectively.

6. A multi-chip module according to claim 5,
wherein a multi-chip module which mounts only the first semiconductor memory chip, and a multi-chip module which mounts both the first semiconductor memory chip and the second semiconductor memory chip are different with respect to the kind of a multi-chip module.

7. A multi-chip module according to claim 6,
wherein the selective signal is supplied to the first semiconductor memory chip and the second semiconductor memory chip from the first semiconductor chip, and the signal route which sends the selective signal does not exist on the mounting substrate.

8. A multi-chip module according to claim 5,
wherein the selective signal is supplied to the first semiconductor memory chip and the second semiconductor memory chip from the first semiconductor chip, and the signal route which sends the selective signal does not exist on the mounting substrate.

* * * * *